United States Patent
Hsieh et al.

(10) Patent No.: US 10,151,862 B2
(45) Date of Patent: Dec. 11, 2018

(54) COLOR FILTER ARRAY HAVING LOW DENSITY OF BLUE COLOR

(71) Applicant: VisEra Technologies Company Limited, Hsin-Chu (TW)

(72) Inventors: Chin-Chuan Hsieh, Hsin-Chu (TW); Wei-Ko Wang, Taoyuan (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/139,844

(22) Filed: Apr. 27, 2016

(65) Prior Publication Data

US 2017/0315278 A1    Nov. 2, 2017

(51) Int. Cl.
| | | |
|---|---|---|
| *G02F 1/1335* | (2006.01) | |
| *G02B 5/20* | (2006.01) | |
| *H01L 27/146* | (2006.01) | |
| *G02B 5/22* | (2006.01) | |

(52) U.S. Cl.
CPC ........ *G02B 5/201* (2013.01); *H01L 27/14621* (2013.01); *G02B 5/22* (2013.01)

(58) Field of Classification Search
CPC ........ H04N 9/735; H04N 9/045; G02B 5/201; H01L 27/14621
USPC ......... 359/885, 891; 349/106; 348/241, 275, 348/273
See application file for complete search history.

(56) References Cited

U.S. PATENT DOCUMENTS

| | | | | |
|---|---|---|---|---|
| 7,701,476 B2* | 4/2010 | Brown Elliott | ... | G02F 1/133514 345/204 |
| 7,755,682 B2* | 7/2010 | Lin | ........................ | H04N 9/045 348/222.1 |
| 8,508,633 B2* | 8/2013 | Hirose | ............... | H04N 5/23203 348/241 |
| 8,970,748 B2* | 3/2015 | Hayashi | ................. | H04N 9/045 348/275 |

FOREIGN PATENT DOCUMENTS

| | | |
|---|---|---|
| CN | 101047862 B | 12/2010 |
| CN | 102484722 A | 5/2012 |
| CN | 103621070 A | 3/2014 |
| CN | 104067611 A | 9/2014 |
| JP | 2005-128571 A | 5/2005 |
| JP | 2014-158267 A | 8/2014 |
| JP | 2015-012619 A | 1/2015 |

(Continued)

OTHER PUBLICATIONS

Office Action dated Jul. 25, 2017 in corresponding JP application No. 2016-144101 with its English translation (7 pgs.).

(Continued)

*Primary Examiner* — Audrey Y Chang
(74) *Attorney, Agent, or Firm* — Muncy, Geissler, Olds & Lowe, P.C.

(57) ABSTRACT

A color filter array having a lower density of the color blue is provided. The color filter array includes: a plurality of color filter units arranged in a 3×3 array. The color filter units include a blue filter and a plurality of other filters, and the blue filter is disposed in the center of each 3×3 array, wherein a number of the blue filter is fewer than that of each kind of the other filters in each 3×3 array.

10 Claims, 6 Drawing Sheets

(56) References Cited

FOREIGN PATENT DOCUMENTS

| | | |
|---|---|---|
| JP | 2016-163306 A | 9/2016 |
| JP | 2017-098533 A | 6/2017 |
| WO | WO 2013/100093 A1 | 7/2013 |

OTHER PUBLICATIONS

Taiwanese Office Action of corresponding TW Application No. 106103922 dated Feb. 22, 2018, 5 pages.

* cited by examiner

| R | G |
|---|---|
| G | B |

FIG. 1 ( PRIOR ART )

COLOR FILTER ARRAY HAVING LOW DENSITY OF BLUE COLOR

BACKGROUND OF THE INVENTION

Field of the Invention

The present invention relates to color filter arrays for image sensors.

Description of the Related Art

In electronic color imaging, it is desirable to simultaneously capture image data in three color planes, usually red, green and blue. When the three color planes are combined, it is possible to create high-quality color images. Capturing these three sets of image data can be done in a number of ways. In electronic photography, this is sometimes accomplished by using a single two dimensional array of sensors that are covered by a pattern of red, green and blue filters. This type of sensor is known as a color filter array or CFA. FIG. 1 is a diagram of a conventional Bayer pattern. FIG. 1 shows that the red (R), green (G) and blue (B) pixels as are commonly arranged in a Bayer pattern on a CFA sensor.

When a color image is captured using a CFA, it is necessary to interpolate the red, green and blue values so that there is an estimate of all three color values for each sensor location. Once the interpolation is done, each picture element, or pixel, has three color values and can be processed by a variety of known image processing techniques depending on the needs of the system. Some examples of the reasons for processing are to do image sharpening, color correction or half toning.

The diagram below shows how red green and blue pixels can be arranged in a particular color filter array pattern, hereinafter referred to as the "Bayer pattern". Because the red, green, and blue filters absorb two thirds of the incident light, such CFA sensors tend to be photometrically slow.

Additionally, the blue cones have a lower density at the center of the fovea of the human eye, and thus the maximum acuity for blue light is lower than that of other colors. Accordingly, there is a demand for a color filter array having a lower density of the color blue, thereby increasing the overall acuity of the primary color components in the image captured by the image sensor.

BRIEF SUMMARY OF THE INVENTION

A detailed description is given in the following embodiments with reference to the accompanying drawings.

In an exemplary embodiment, a color filter array having a lower density of the color blue is provided. The color filter array includes: a plurality of color filter units arranged in a 3×3 array. The color filter units comprise a blue filter and a plurality of other filters, and the blue filter is disposed in the center of each 3×3 array, wherein a number of the blue filter is fewer than that of each kind of the other filters in each 3×3 array.

In the embodiment, the other filers in each 3×3 array comprise four red filters, and four green filters. For example, the red filters are disposed vertically and horizontally adjacent to the blue filter, and the four green filters are disposed at four corners of the 3×3 array. Alternatively, the red filters are disposed vertically and horizontally adjacent to the blue filter, and the four green filters are disposed at four corners of the 3×3 array.

In another exemplary embodiment, the other filters in each 3×3 array comprise two red filters, two green filters, and four white/transparent filters.

For example, the two red filters are disposed horizontally adjacent to the blue filter, and the two green filters are disposed vertically adjacent to the blue filter, and the four white/transparent filters are disposed at four corners of the 3×3 array.

Alternatively, the two green filters are disposed horizontally adjacent to the blue filter, and the two red filters are disposed vertically adjacent to the blue filter, and the four white/transparent filters are disposed at four corners of the 3×3 array.

Alternatively, the four white/transparent filters are disposed vertically and horizontally adjacent to the blue filter, and the two red filters are disposed at two corners of a main diagonal of the 3×3 array, and the two green filters are disposed at two corners of an anti-diagonal of the 3×3 array.

Alternatively, the four white/transparent filters are disposed vertically and horizontally adjacent to the blue filter, and the two green filters are disposed at two corners of a main diagonal of the 3×3 array, and the two red filters are disposed at two corners of an anti-diagonal of the 3×3 array.

BRIEF DESCRIPTION OF THE DRAWINGS

The present invention can be more fully understood by reading the subsequent detailed description and examples with references made to the accompanying drawings, wherein:

FIG. 1 is a diagram of a conventional Bayer pattern;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
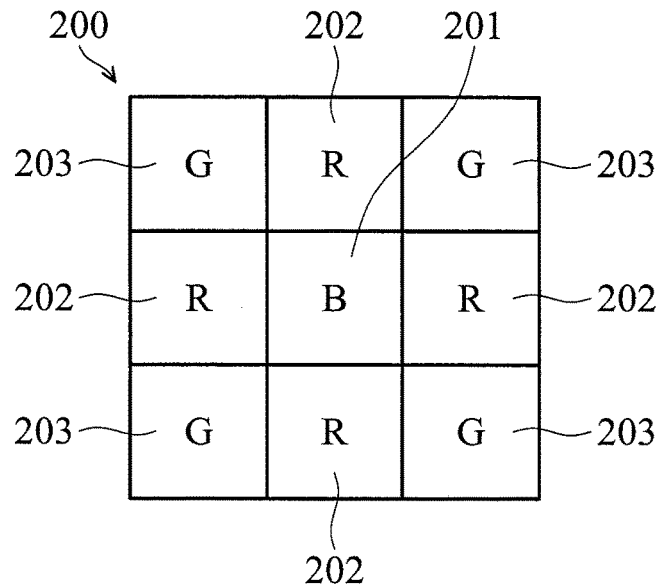
FIGS. 2A~2B are plan views of a CFA in accordance with an embodiment of the invention.
Figure 2B:
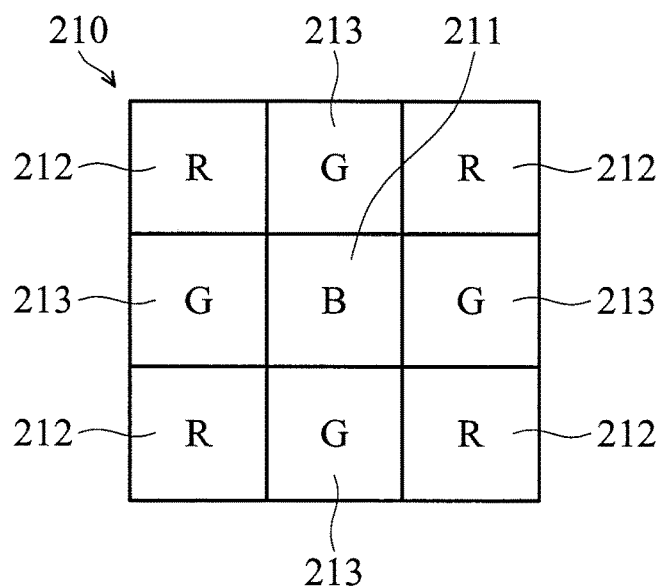

FIGS. 2A-2B are plan views of a CFA in accordance with an embodiment of the invention. The CFA 200 shown in FIG. 2A includes a single 3×3 array having three types of color filter units such as four green filters, four red filters, and one blue filter. For example, the blue filter 201 is placed in the center of the 3×3 array of the CFA 200, and the green and red filters are arranged around the blue filter 201 symmetrically. Specifically, the blue filter 201 is placed in the center of the 3×3 array of the CFA 200, and the red filters 202 are disposed horizontally and vertically adjacent to the blue filter 201. The green filters 203 are disposed at four corners of the 3×3 array of the CFA 200.

Alternatively, the CFA 210 shown in FIG. 2B also includes a single 3×3 array having three types of color filter units such as four green filters, four red filters, and one blue filter. Similarly, the blue filter 211 is disposed in the center of the 3×3 array of the CFA 210, and the green and red filters are disposed around the blue filter 211 symmetrically. Specifically, the blue filter 211 is placed in the center of the 3×3 array of the CFA 200, and the green filters 213 are disposed horizontally and vertically adjacent to the blue filter 211. The red filters 212 are disposed at four corners of the 3×3 array of the CFA 210.

Figure 3A:
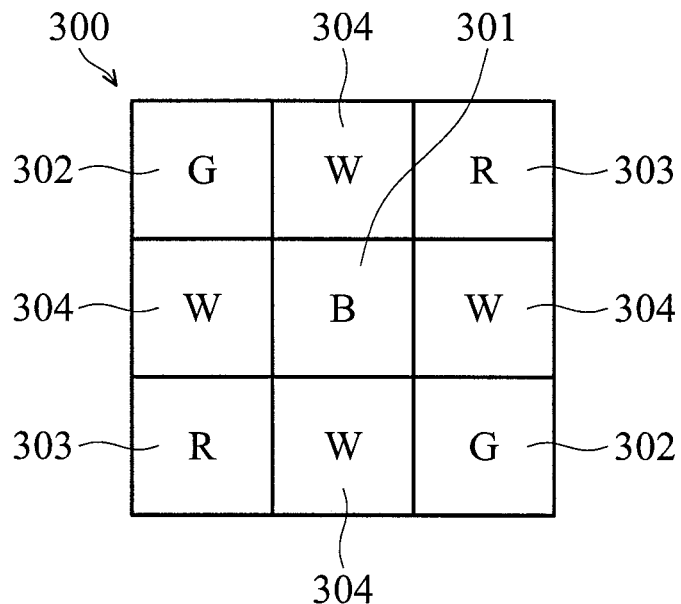
FIGS. 3A~3D are plan views of a CFA in accordance with an embodiment of the invention.

FIGS. 3A-3D are plan views of a CFA in accordance with an embodiment of the invention. Each of the CFAs 300~330 shown in FIGS. 3A-3D includes a single 3×3 array having four types of color filter units such as two green filters, two red filters, four white/transparent filters, and one blue filter. That is, the ratio of the numbers of the white/transparent (W), red (R), green (G), and blue filters (B) can be expressed as: W:R:G:B=4:2:2:1. It should be noted that the transparent materials are used in the white filters, and thus the red, green, and blue lights may pass through the white/transparent filters. For example, as shown in FIG. 3A, the blue filter 301 is placed in the center of the 3×3 array of the CFA 300, and the green, red, and white/transparent filters are arranged around the blue filter 201 symmetrically. Specifically, the white/transparent filters 304 are disposed vertically and horizontally adjacent to the blue filter 301, and the green filters 302 and red filters 303 are disposed at two corners of two diagonal lines of the 3×3 array of the CFA 300, respectively.

Figure 3B:
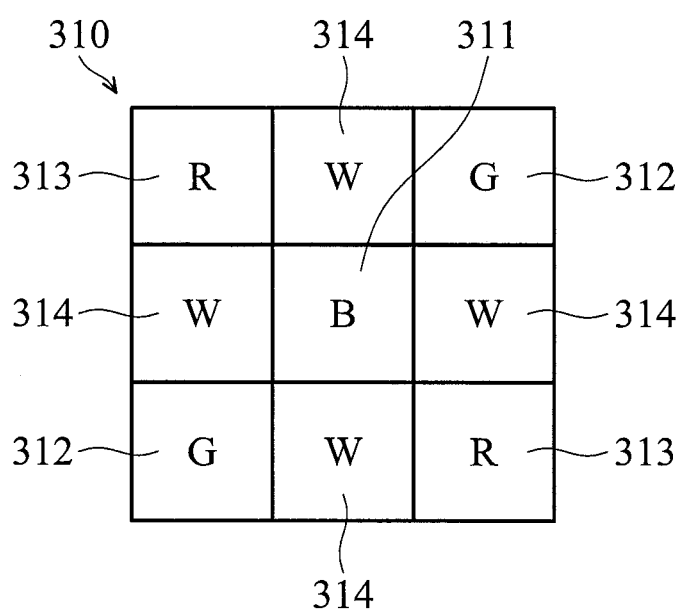

For example, the green filters 302 are disposed at two corners of the main diagonal (i.e. the diagonal from upper-left to bottom-right) of the 3×3 array, and the red filters 303 are disposed at two corners of the anti-diagonal (i.e. the diagonal from upper-right to bottom-left) of the 3×3 array of the CFA 300. The arrangement of CFA 310 shown in FIG. 3B is similar to that of CFA 300 in FIG. 3A, and the difference is that the green filters 312 and red filters 313 are disposed at two corner of different diagonal lines of the 3×3 array of the CFA 310. Specifically, the red filters 313 are disposed at two corners of the main diagonal (i.e. the diagonal from upper-left to bottom-right) of the 3×3 array of the CFA 310, and the green filters 312 are disposed at two corners of the anti-diagonal (i.e. the diagonal from upper-right to bottom-left) of the 3×3 array of the CFA 310.

Figure 3C:
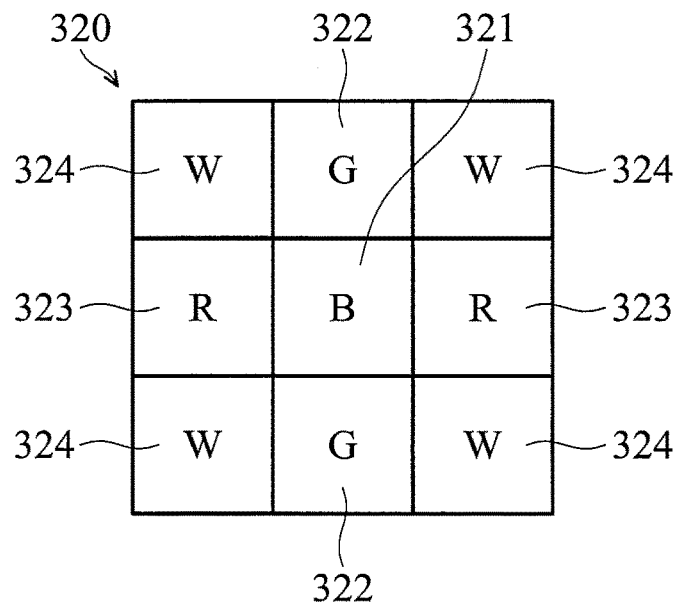
Figure 3D:
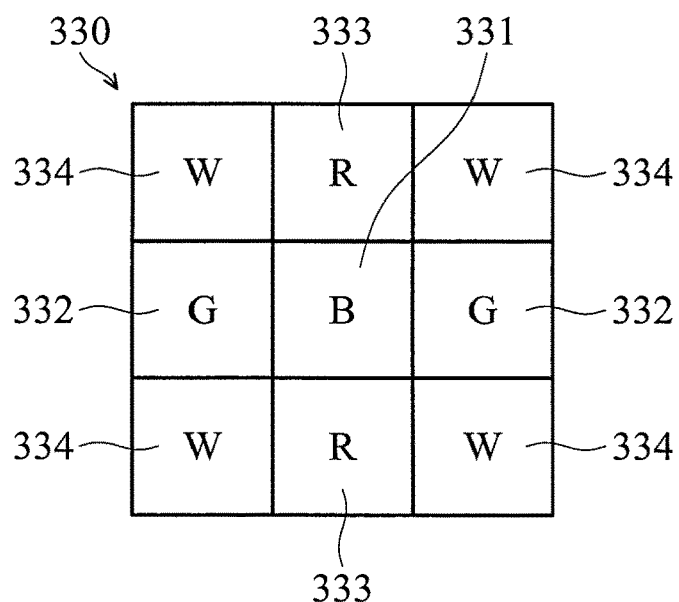

Additionally, the arrangement of the color filter units in the 3×3 array of CFAs 320 and 330 are different from that of the CFAs 300 and 310. For example, as shown in FIG. 3C, the blue filter 301 is placed in the center of the 3×3 array of the CFA 320, and the green, red, and white/transparent filters 324 are arranged around the blue filter 201 symmetrically. However, the red filters 323 are disposed horizontally adjacent to the blue filter 321, and the green filters 322 are disposed vertically adjacent to the blue filter 321. Meanwhile, the white/transparent filters 324 are disposed at four corners of the 3×3 array of the CFA 320.

Regarding color filter units in the 3×3 array of the CFA 330, the green filters 332 are disposed horizontally adjacent to the blue filter 331, and the red filters 333 are disposed vertically adjacent to the blue filter 331. Meanwhile, the white/transparent filters 334 are disposed at four corners of the 3×3 array of the CFA 330.

In view of the above, various CFA patterns have been disclosed. Generally, each of the CFAs in the disclosure has a low density of the color blue that is less sensitive to the human eyes when compared with other primary color components such as green and red colors. It should be noted that, for purposes of description, each of the CFAs in FIGS. 2A-2B and 3A-3D is illustrated with a single 3×3 array. One having ordinary skill in the art will appreciate that a CFA may include a plurality of 3×3 arrays, where each 3×3 array includes a plurality of color filter units.

Figure 1:
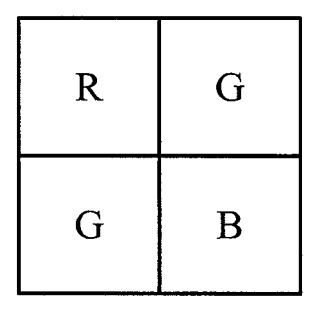

Additionally, with the help of white/transparent pixels (i.e. clear pixels) that comprises green, blue, and red colors, the image sensor may obtain higher average sensitivity for each pixel. For example, given that the respective sensitivity of the white/transparent pixel, green pixel, red pixel, and blue pixel are 1, ⅓, ⅓, and ⅓, the overall average sensitivity of the Bayer pattern shown in FIG. 1 is ((⅓)*4)/4 pixels=33% light/pixel. For the CFAs 300~330 shown in FIGS. 3A-3D, the overall average sensitivity is ((⅓)*5+1*4)/9 pixels=63% light/pixel. Accordingly, the CFA patterns in FIGS. 3A~3D have a significant gain of the sensitivity due to the low density of the blue filter, so that the user may perceive a brighter image. It should be noted that the numbers of the sensitivities of different colors are for purposes of description. In fact, the green color gains more than ⅓ of light, and red and blue colors gains around ⅓ of light. For example, the ratio of sensitivities of the blue, green, and red colors using a 650 nm IR-cut filters is approximately 11:22:19. In other words, if more green and red color filter units are used to replace the blue filter, more light can be collected by the image sensor.

It should be noted that the diffraction limit is coming while developing products with pixel less than 1 um², and a CFA pattern using a 3×3 array is a good choice to replace the widely used Bayer pattern. It should also be noted that the white/transparent color and the primary color components such as green, blue, and red colors simultaneously exist in the CFA patterns 300~330 disclosed in the present invention, and it would be more convenient for those skilled in the art to recover the absent color components in each pixel, thereby obtaining an image having higher image quality. It should also be noted that the number of the blue filter is fewer than each kind of the other filters such as red filters, green filters, and/or white/transparent filters in the CFAs described in the embodiments of FIGS. 2A~2B and FIGS. 3A~3D.

Figure 4A:
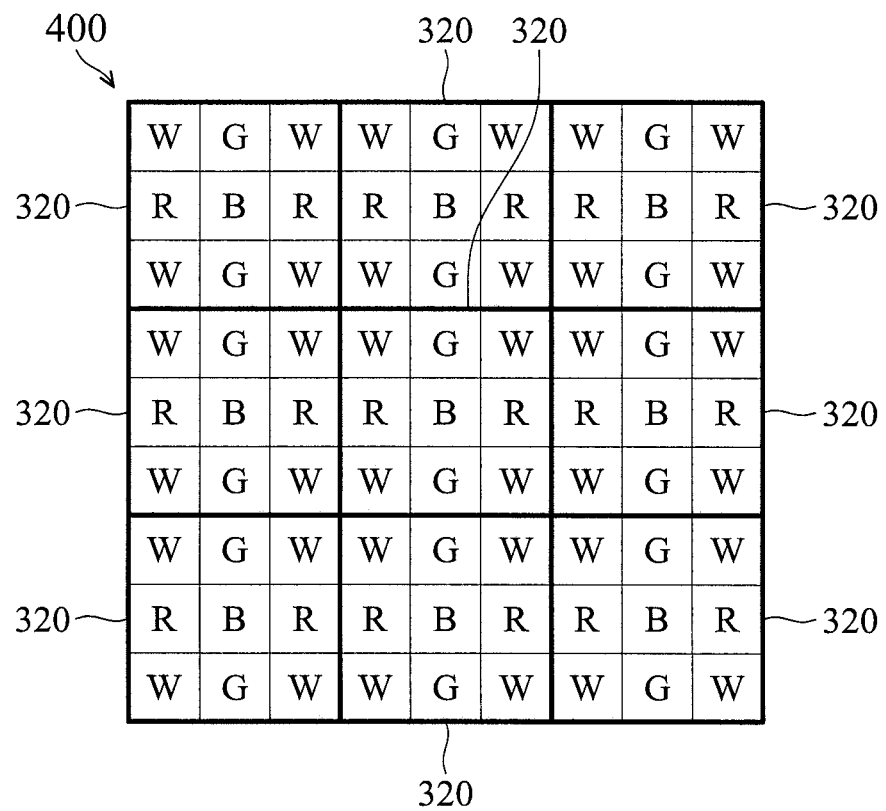
FIGS. 4A~4B are plan views of an image sensor using 3×3 arrays comprising a plurality of color filter array units in accordance with an embodiment of the invention.
Figure 4B:
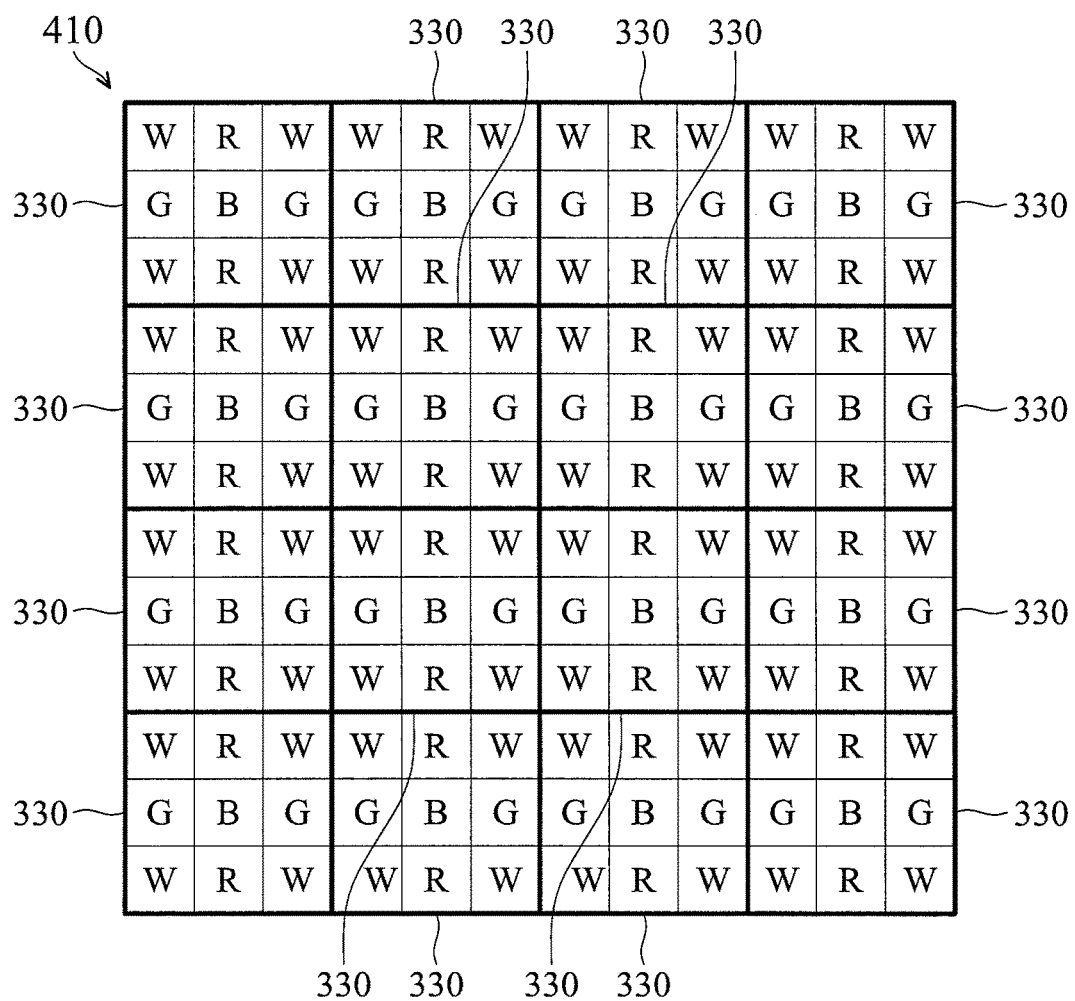

FIGS. 4A~4B are plan views of an image sensor using 3×3 arrays comprising a plurality of color filter array units in accordance with an embodiment of the invention. In an embodiment, the 3×3 arrays having different color filter array units described in the aforementioned embodiments of FIGS. 2A-2B and 3A-3D can be arranged repeatedly in an image sensor or a photo diode array. For example, given that the basic 3×3 array is the 3×3 array in the CFA 320 shown in FIG. 3C, the 3×3 array of the CFA 320 is repeatedly disposed and arranged into a 9×9 array 400 in the image sensor 400, as shown in FIG. 4A. Similarly, given that the basic 3×3 array is the 3×3 array in the CFA 330 shown in FIG. 3D, the 3×3 array of the CFA 330 is repeatedly disposed and arranged into a 12×12 array 410 in the image sensor, as shown in FIG. 4B. In addition, the arrays 400 and 410 can also be used as a basic array of the color filter array in the image sensor or photo diode array. Similarly, the 3×3 array of the CFA 320 can be arranged into a 3N×3N array that is used as a basic array of a new color filter array, where N is a positive integer. For example, N=3 for the array 400, and N=4 for the array 410.

It should be noted the CFA 320 and CFA 330 are for the purpose of description, and one having ordinary skill in the art will appreciate that the 3×3 array in any one of the CFAs disclosed in the aforementioned embodiments can be disposed repeatedly in an image sensor or a photo diode array.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A color filter array, comprising:
a plurality of 3×3 arrays, wherein each 3×3 array comprises a plurality of color filter units,
wherein the color filter units in each 3×3 array comprise a blue filter and a plurality of other filters, and the blue filter is disposed in the center of each 3×3 array,
wherein a number of the blue filter is fewer than that of each kind of the other filters in each 3×3 array, and
wherein the plurality of 3×3 arrays are arranged directly next to each other in both a lateral direction and a transverse direction,
wherein the other filters in each 3×3 array comprise two red filters, two green filters, and four white/transparent filters, and
wherein the two red filters are disposed horizontally adjacent to the blue filter, and the two green filters are disposed vertically adjacent to the blue filter, and the four white/transparent filters are disposed at four corners of the 3×3 array.

2. The color filter array as claimed in claim 1, wherein the 3×3 arrays are arranged into a plurality of 3N×3N arrays, wherein N is a positive and odd integer.

3. A color filter array, comprising:
a plurality of 3×3 arrays, wherein each 3×3 array comprises a plurality of color filter units,
wherein the color filter units in each 3×3 array comprise a blue filter and a plurality of other filters, and the blue filter is disposed in the center of each 3×3 array,
wherein a number of the blue filter is fewer than that of each kind of the other filters in each 3×3 array, and
wherein the plurality of 3×3 arrays are arranged directly next to each other in both a lateral direction and a transverse direction,
wherein the other filters in each 3×3 array comprise two red filters two green filters, and four white/transparent filters, and
wherein the two green filters are disposed horizontally adjacent to the blue filter, and the two red filters are disposed vertically adjacent to the blue filter, and the four white/transparent filters are disposed at four corners of the 3×3 array.

4. The color filter array as claimed in claim 3, wherein the 3×3 arrays are arranged into a plurality of 3N×3N arrays, wherein N is a positive and odd integer.

5. A color filter array, comprising:
a plurality of 3×3 arrays, wherein each 3×3 array comprises a plurality of color filter units,
wherein the color filter units in each 3×3 array comprise a blue filter and a plurality of other filters and the blue filter is disposed in the center of each 3×3 array,
wherein a number of the blue filter is fewer than that of each kind of the other filters in each 3×3 array, and
wherein the plurality of 3×3 arrays are arranged directly next to each other in both a lateral direction and a transverse direction,
wherein the other filters in each 3×3 array comprise two red filters, two green filters, and four white/transparent filters, and
wherein the four white/transparent filters are disposed vertically and horizontally adjacent to the blue filter, and the two red filters are disposed at two corners of a main diagonal of the 3×3 array, and the two green filters are disposed at two corners of an anti-diagonal of the 3×3 array.

6. The color filter array as claimed in claim 5, wherein the 3×3 arrays are arranged into a plurality of 3N×3N arrays, wherein N is a positive and odd integer.

7. A color filter array, comprising:
a plurality of 3×3 arrays, wherein each 3×3 array comprises a plurality of color filter units,
wherein the color filter units in each 3×3 array comprise a blue filter and a plurality of other filters, and the blue filter is disposed in the center of each 3×3 array,
wherein a number of the blue filter is fewer than that of each kind of the other filters in each 3×3 array and
wherein the plurality of 3×3 arrays are arranged directly next to each other in both a lateral direction and a transverse direction,
wherein the other filters in each 3×3 array comprise two red filters, two green filters, and four white/transparent filters, and
wherein the four white/transparent filters are disposed vertically and horizontally adjacent to the blue filter, and the two green filters are disposed at two corners of a main diagonal of the 3×3 array, and the two red filters are disposed at two corners of an anti-diagonal of the 3×3 array.

8. The color filter array as claimed in claim 7, wherein the 3×3 arrays are arranged into a plurality of 3N×3N arrays, wherein N is a positive and odd integer.

9. A color filter array, comprising:
a plurality of 3×3 arrays, wherein each 3×3 array comprises a plurality of color filter units,
wherein the color filter units in each 3×3 array comprise a blue filter and a plurality of other filters, and the blue filter is disposed in the center of each 3×3 array,
wherein a number of the blue filter is fewer than that of each kind of the other filters in each 3×3 array,
wherein the other filters in each 3×3 array comprise four red filters and four green filters, and
wherein the four red filters are disposed vertically and horizontally adjacent to the blue filter, and the four green filters are disposed at four corners of the 3×3 array.

10. The color filter array as claimed in claim 9, wherein the 3×3 arrays are arranged into a plurality of 3N×3N arrays, wherein N is a positive and odd integer.

* * * * *